United States Patent [19]

Daniele

[11] Patent Number: 4,639,999

[45] Date of Patent: Feb. 3, 1987

[54] HIGH RESOLUTION, HIGH EFFICIENCY I.R. LED PRINTING ARRAY FABRICATION METHOD

[75] Inventor: Joseph J. Daniele, Pittsford, N.Y.

[73] Assignee: Xerox Corporation, Stamford, Conn.

[21] Appl. No.: 667,706

[22] Filed: Nov. 2, 1984

[51] Int. Cl.⁴ .............................................. H01L 7/36
[52] U.S. Cl. ................................. 29/569 L; 29/576 E; 148/175; 156/653
[58] Field of Search .................. 29/569 L, 577 R, 589, 29/576 E; 357/17; 372/42, 48, 50; 148/175; 756/643, 644, 651, 652, 653

[56] References Cited

U.S. PATENT DOCUMENTS

| | | | |
|---|---|---|---|
| 3,758,875 | 9/1973 | Hayashi | 331/94.5 |
| 3,899,826 | 8/1975 | Russ | 29/583 |
| 3,912,556 | 10/1975 | Grenon et al. | 148/175 |
| 4,196,508 | 4/1980 | Lorenze, Jr. | 29/577 R |
| 4,213,805 | 7/1980 | Tsukada | 148/171 |
| 4,331,938 | 5/1982 | Limm et al. | 372/50 |
| 4,339,689 | 7/1982 | Yamanaka et al. | 313/499 |
| 4,408,331 | 10/1983 | Hartman et al. | 372/46 |
| 4,416,011 | 11/1983 | Olsen | 372/45 |
| 4,418,472 | 12/1983 | Lorenze, Jr. | 29/603 |
| 4,429,395 | 1/1984 | Olsen et al. | 372/45 |
| 4,438,446 | 3/1984 | Tsang | 357/17 |
| 4,445,125 | 4/1984 | Scifres et al. | 346/108 |
| 4,504,952 | 3/1985 | Hartman et al. | 372/45 |
| 4,546,480 | 10/1985 | Burnham et al. | 372/45 |
| 4,547,956 | 10/1985 | Bouadma et al. | 29/569 L |
| 4,587,717 | 5/1986 | Daniele et al. | 29/569 L |

OTHER PUBLICATIONS

Marihace et al, "Electroluminescent Anodes & Arrays", IBM Technical Disclosure Bulletin, vol. 8, No. 11, Apr. 1966.
Yeh et al, "Light-Emitting Diode Array", IBM Technical Disclosure Bulletin, vol. 9, No. 3, Aug. 1966.
Berkenblit et al, "Fabricating Light Emitting Diodes", IBM Technical Disclosure Bulletin, vol. 13, No. 6, Nov. 1970.
Pickar et al, "Fabrication for Light-Emitting Diode Array", IBM Tech. Dis. Bull., vol. 16, No. 10, Mar. 1974.
T. Sugahara et al, "Monolithic 1×4 Array of Uniform Radiance AlGaAs-GaAs LED's Grown by Molecular Beam Epitaxy", Jpn. J. Appl. Phys. 21, 6, pp. L349-350, 1982.
T. Sugahara et al, "High Radiance AlGaAs DH LED Array by MBE", Fujitsu Sci. Tech. J., 19, 3, pp. 315-322, Sep. 1983.

Primary Examiner—Brian E. Hearn
Assistant Examiner—Tuan Quach
Attorney, Agent, or Firm—Frederick E. McMullen

[57] ABSTRACT

An IR LED array and method of fabrication having a GaAs wafer with one surface metallized to form a common LED contact. Epitaxially formed on this wafer is a GaAs/GaAlAs heterostructure with successive layers of $Ga_{1-x}Al_x$ As-n, GaAs-p, and $Ga_{1-y}Al_y$ As-p on the other surface, followed by an electrical contact layer of GaAs-p+ and an insulating layer of $SiO_2$, discrete areas of the contact and insulating layers being removed by etching to form viewing windows for the individual LEDs, and with the area of the contact layer bordering the viewing windows being exposed and metallized to provide individual LED electrical contacts.

In a second embodiment, the GaAs-p+ layer is dispensed with and the transparent electrically conducting coating is applied directly on both the insulating layer bordering the $Ga_{1-y}Al_y$As viewing windows and over the viewing windows. In a third embodiment, and edge emitting LED variant is provided and in a fourth embodiment, various light barrier designs are proposed for preventing optical crosstalk between the individual LEDs.

9 Claims, 8 Drawing Figures

HIGH RESOLUTION, HIGH EFFICIENCY I.R. LED PRINTING ARRAY FABRICATION METHOD

The invention relates to LED arrays, and more particularly, to high efficiency IR or near IR LED arrays for high speed, high resolution printing.

With the advent of commercially available infra-red (I.R.) photoreceptors, the use of a Light Emitting Diode (LED) array to write images on the photoreceptor has taken on renewed interest. As will be understood, arrays of this type comprise one or more linear rows of LEDs in close juxtaposition with one another to form in effect a light bar which, through selective actuation of the individual LEDs in accordance with an image input signal, exposes the photoreceptor to create or write a latent electrostatic image thereon. The latent electrostatic image created is thereafter processed xerographically to produce a permanent visible copy of the image.

This renewed interest is primarily due to the fact that IR LEDs can be made with an efficiency more than an order of magnitude, and in some cases two orders of magnitude, greater than present day visible LEDs. Moreover, because of recent advances in materials preparation, such as Metalorganic Chemical Vapor Deposition (MOCVD) and Molecular Beam Epitaxy (M.B.E.), IR LEDs can now be made from direct gap commercially viable materials like Gallium Arsenide (GaAs) or Gallium Aluminum Arsenide (GaAlAs) in heterostructures which show reliability and uniformity much superior to previous visible LEDs. However, because these high efficiency IR LED arrays are structured differently than previous LED arrays, IR LED arrays have their own constraints and advantages.

Because of past photoreceptor spectral limitations and the consequent unavailability of IR photoreceptors, LED arrays are currently made from zinc diffused Gallium Arsenide Phosphide (Ga(As,P)) grown epitaxially on Gallium Arsenide (GaAs) or Gallium Phosphide (GaP). As will be understood, Ga(As,P) is an indirect gap semiconductor and LEDs constructed of this material are of relatively low external efficiency, usually 0.02 to 0.05%. With nitrogen doping, efficiency may be raised to 0.2 to 0.5% but there are uniformity problems associated with this.

These types of LED arrays are also lambertian radiators. The light typically must be collected by gradient index fiber lenses (with a Numerical Aperture of 0.08 to 0.3). This results in low overall optical system efficiency, usually less than 5%. Moreover, for a typical 3300 spot or pixel system, the LEDs that comprise the array must be time multiplexed by a factor of 20 or so or else 3300 drive transistors must be used. These factors combine to produce a very low level of energy at the photoreceptor, with resultant limitation of the processing speed to the approximately 2 inches/second range.

Moreover, since III–V class LED materials are easily damaged by saw cutting, etc., the small LED chips containing a plurality of LEDs cannot normally be butted together but instead must be staggered in two rows and then optically interlaced using two gradient index fiber lenses. The preferred system of cleaving and butting the LED chips cannot be done with these materials due to the large lattice mismatch, multiple networks of misfit dislocations, and the high level of strain between the Ga(As,P) and the LED substrate. Also, because of the presence of dislocation networks, LED arrays of this type tend to be non-uniform, with efficiencies typically varying by $+-20\%$ within arrays. Further, LED arrays of this type are also subject to slow degradation, there being a statistical distribution of degradation among the individual LEDs that comprise the array, so that some LEDs degrade much faster than others. As a result, this type of LED array usually requires continuous calibration to assure overall long term uniformity of output, such calibration being typically accomplished through automatic adjustment of the drive current to each LED.

The invention seeks to obviate the foregoing problems and shortcomings of typical visible LED arrays by providing a high speed, high resolution IR LED array of high efficiency for printing images comprising: a GaAs-n wafer with one side metallized to provide a common electrical contact for the array LEDs; a first layer of $Ga_{1-x}Al_xAs$-n on the other side of the wafer; a second layer of GaAs-p on the first layer; a third layer of $Ga_{1-y}Al_yAs$-p on the second layer; an insulating layer of $SiO_2$ (or other suitable insulator) on the third layer, a portion of the insulating layer being removed at selected points to expose predetermined areas of the third layer to form viewing windows for each of the LEDs; and a metallized layer on at least the exposed area of the third layer to provide electrical contacts for each of the LEDs.

The invention further relates to a method for fabricating a high speed high resolution IR LED array for printing images, comprising the steps of: metallizing one surface of a GaAs-n substrate to provide a common electrical contact for the LEDs; epitaxially growing a first layer of $Ga_{1-x}Al_xAs$-n on the other surface of the substrate; growing a second layer of GaAs-p on the first layer; growing a third layer of $Ga_{1-y}Al_yAs$-p on the second layer; depositing an insulating layer of $SiO_2$ on the third layer; etching the insulating layer at selected points to expose predetermined areas of the third layer and form viewing windows defining each of the LEDs; and metallizing at least the exposed area of the third layer to provide individual electrical contacts for each of the LEDs.

IN THE DRAWINGS

Figure 1:
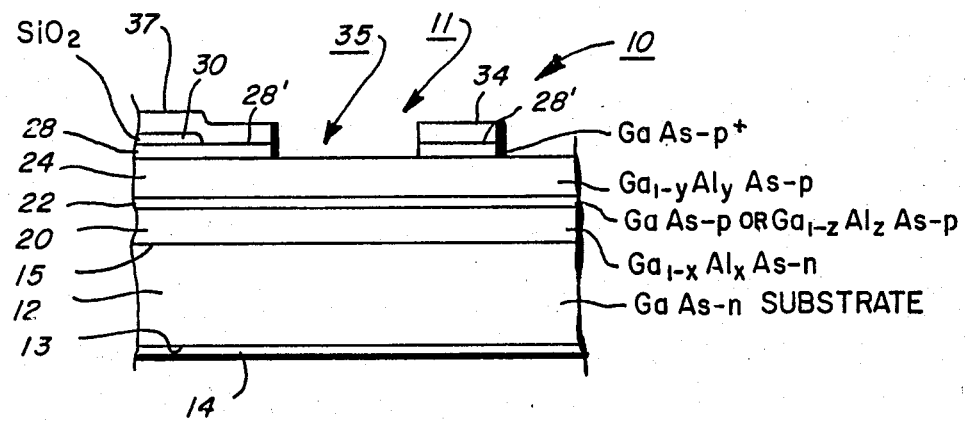
FIG. 1 is a side view in cross section of a surface emitting type IR LED fabricated in accordance with the teachings of the present invention.
Figure 2:
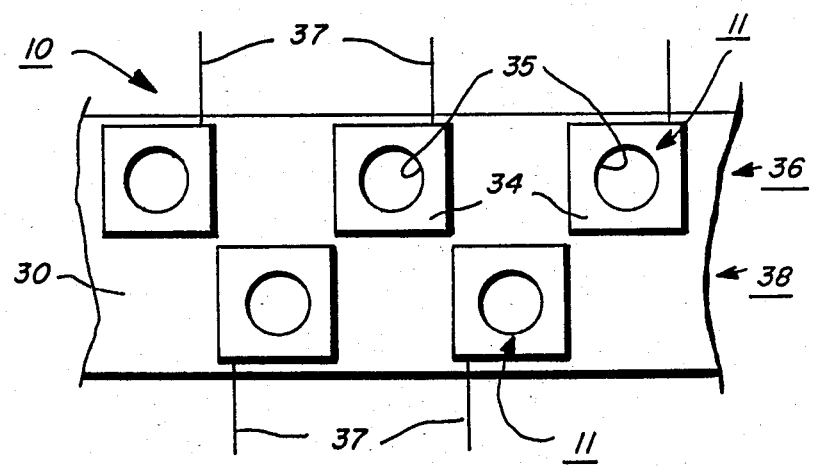
FIG. 2 is a top view showing the IR LED of FIG. 1 in a multiple LED array.

Referring now to FIGS. 1 and 2 of the drawings, a high efficiency heterostructure array 10 of IR LEDs 11 fabricated in accordance with the teachings of the present invention is there shown. In the ensuing description and drawings, Ga refers to gallium, Al to aluminum, and As to arsenic. Heterostructure LED array 10 has a GaAs-n wafer or substrate 12, with one side 13 metallized to form a common electrical contact surface 14 for the LEDs of the array. A first layer 20 composed of $Ga_{1-x}Al_xAs$-n is grown on the opposite side 15 of substrate 12 followed by a layer 22 of either GaAs-p or $Ga_{1-z}Al_zAs$-p and a layer 24 of $Ga_{1-y}Al_y$ As-p. The thickness of substrate 12 is approximately 0.010 to 0.015 inches while the combined thickness of layers 20, 22, 24 is approximately 5 to 10 microns. Suitable ranges for x, y and z and approximate layer thicknesses for this embodiment are given in Table I.

An electrical contact layer 28 of GaAs-p+ (heavily doped p-type), which forms an electrical contact area for a metallization layer 34, is next grown over the layer 24 followed by an insulating layer 30 such as $SiO_2$. Contact and insulating layer 28, 30 are selectively etched at predetermined points to form an LED light emitting area or window 35 of predetermined dimension and configuration defining each LED 11, LEDs 11 being formed a preset spaced intervals along wafer 12 in the array configuration desired. In the example shown in FIGS. 1 and 2, LEDs 11 are formed in parallel rows 36, 38 with the LEDs of each row being offset or staggered with respect to the LEDs of the other row. Further selective etching is used to remove the portion of insulating layer 30 bordering the LED windows 35 and uncover a portion 28' of contact layer 28. The uncovered portions 28' of bonding layer 28 surrounding each LED 11 is metallized at 34 to form a metal contact pad for each LED. A metal lead 37 is bonded to each LED contact pad.

While array 10 is shown and described as comprising two rows of LEDs 11, array 10 may comprise one or any number of parallel rows of LEDs 11 as will be understood.

Figure 3:
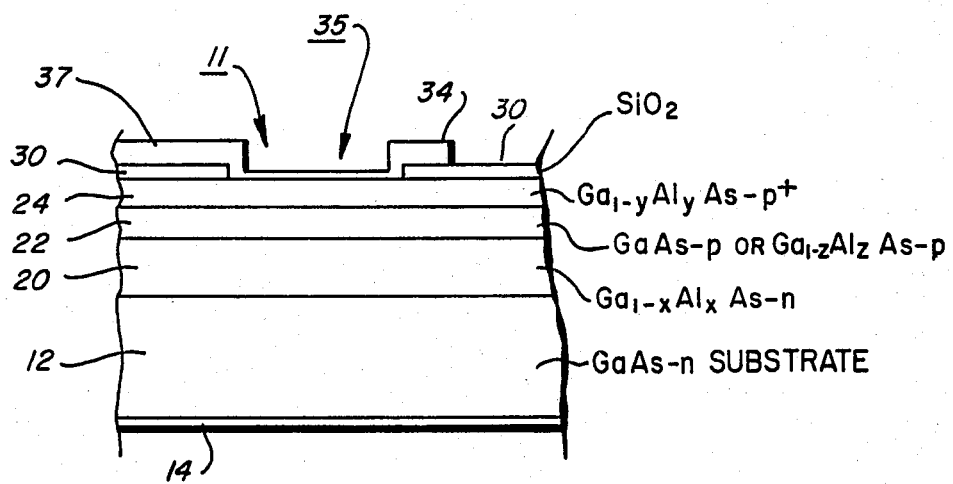
FIG. 3 is a side view in cross section depicting an alternate surface emitting type IR LED array construction.
Figure 4:
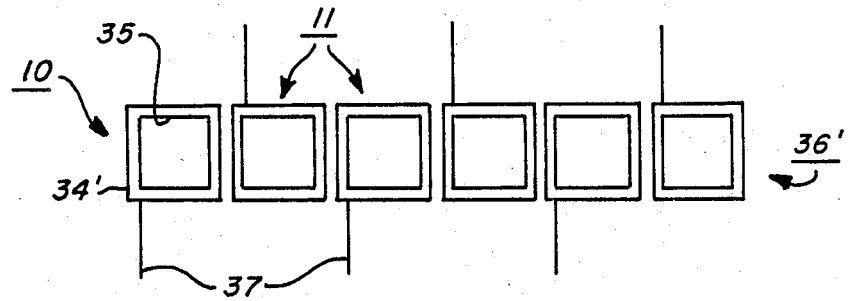
FIG. 4 is a top view of the IR LED shown in FIG. 3 in a multiple LED array.

In the embodiment shown in FIGS. 3 and 4, where like numbers refer to like parts, the LEDs 11 of array 10 are there formed in a single row 36'. In this embodiment, contact layer 28 is dispensed with and the metallization layer 34 is placed directly on third layer 24 including the light emitting windows 35 of LEDs 11. In this embodiment, metallization layer 34 is made extremely thin (or of a suitable transparent electrically conducting material) so that layer 34 is transparent to the light emitting windows 35 of LEDs 11. Suitable ranges for x, y and z and approximate layer thicknesses for this embodiment are given in Table II.

In the embodiment shown in FIGS. 1-4, array 10 comprises one or more linear arrays of surface emitting LEDs. In the embodiment shown in FIGS. 5 and 6, where like numbers refer to like parts, array 10 comprises a linear array of edge emitting LEDs. Referring thereto, a first layer 50 of $Ga_{1-x}Al_xAs$-n is grown on substrate 12 followed by an emitting layer 52 of GaAs-p or $Ga_{1-z}Al_zAs$-p. In this arrangement, LEDs 11 emit from layer 52 along edge 55 of substrate 12. Layer 56 of $Ga_{1-y}Al_yAs$-p is grown on layer 52 followed by contact layer 28 and insulating layer 30. Suitable ranges for x, y and z and approximate layer thicknesses for this embodiment are given in Table III.

In all of the above structures, a layer of GaAs-n of 1 to 5 microns thick may be grown prior to the first $Ga_{1-x}Al_xAs$ layer to act as a buffer layer and improve crystal quality. If this buffer layer is used, first layer 20 (FIGS. 1-4) or 50 (FIGS. 5, 6) can be as thin as approximately 0.5 to 1.0 microns.

Insulating layer 30 is selectively etched to uncover a generally rectangular area 58 of contact layer 28 above each LED 11. A strip-like portion 59 of metallization layer 34 is removed along each side to provide electrical isolation between adjoining LEDs of the array. Metallization layer 34 covers the areas 58 of contact layer 28 to form contact pads 60 for the LEDs 11. Leads 37 are bonded to contact pads 60.

Figure 7:
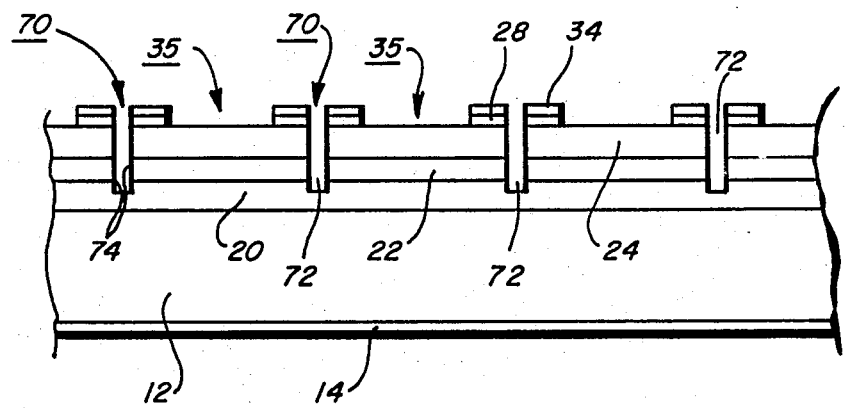
FIG. 7 is a side view in cross section of the IR LED array shown with barriers to prevent optical cross talk between adjoining LEDs.
Figure 8:
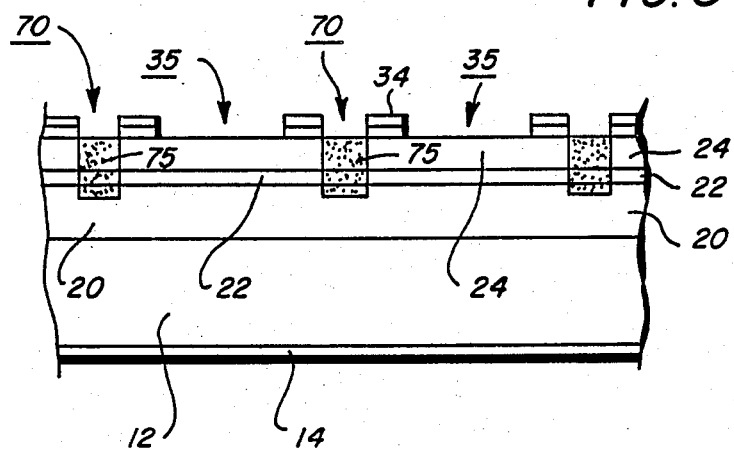
FIG. 8 is a side view in cross section illustrating a cross talk preventing barrier formed by proton bombardment.

Referring now to the embodiments shown in FIGS. 7 and 8, where like numbers refer to like parts, to avoid crosstalk between adjoining LEDs 11 of array 10 due to internal material transparency which permits an "on" LED to cross couple light into an adjacent "off" LED, a light barrier 70 is provided between adjoining LEDs 11. In the arrangement shown in FIG. 7, barrier 70 is produced by etching, either chemically or through an ion etch, a channel 72 through metal contact layer 34, contact layer 28, $Ga_{1-y}Al_y$As-p layer 24, GaAs-p layer 22 and either into or through the $Ga_{1-x}As_x$ As-n layer 20. The interior walls of channel 72 are coated with a suitable light reflective or absorbing layer 74. Where a reflective light barrier is desired, layer 74 may comprise any suitable light reflecting material such as a reflective metal with a suitable insulator layer thereunder to prevent short circuiting of the LED. Where a light absorbing layer is desired, layer 74 may comprise any suitable non-conducting light absorbing material such dyed polyimide or developed, dyed photoresist.

In the embodiment shown in FIG. 8, light barrier 70 is formed by controlled proton bombardment using a mask to expose the region between adjoining LEDs 11, the latter producing a barrier region 75 of high optical absorption and high electrical resistivity. Additionally, the embodiments shown in FIGS. 7 and 8 will reduce lateral current spreading under the electrical contact 28' and in layers 28, 24, and 22 and improve the efficiency of the LEDs.

While light barrier 70 is illustrated as comprising a channel-like recess having a generally rectangular shape when viewed in the cross section, other configurations such as a V-shape, may be envisioned.

The invention provides high speed, high resolution heterostructure IR LEDs which consist of high quality, low strain, low dislocation density single crystals of a known and well controlled orientation, usually (100). Arrays 10 embodying the IR LEDs of the present invention can be readily cleaved in a controlled fashion as is routinely done in the fabrication of laser diodes. As a result, the techniques developed for the cutting and butting of silicon photodetector arrays are directly applicable thereby enabling long IR LED arrays capable of writing one or more image lines at a time to be economically formed.

Similar heterostructure LED arrays may also be formed using the Indium Gallium Arsenide Phosphide (InGaAsP) material system. The LEDs also can operate with high efficiency and can be made for the wavelength range of approximately 1.1 to 1.7 microns.

As has been described in U.S. Pat. No. 4,424,524 issued on Jan. 3, 1984 to Joseph J. Daniele et al, LED arrays of the type described herein can also be used as photodiode arrays for image recording. Since GaAs/GaAlAs and InGaAsP are direct band gap materials, they should provide high optical absorption and efficient photodiode array systems.

TABLE I

Approximate Compositions And Thicknesses Of Various Layers Shown In FIGS. 1 and 2:

| Layer | Approx. Composition (atomic fraction) | Approx. Thickness (microns) |
|---|---|---|
| 20 | x = 0.2 to 0.5 | 2 to 10 |
| 22 | z = 0.0 (GaAs) | 0.3 to 1.0 |
| 24 | y = 0.2 to 0.5 | 1 to 2 |
| 28 | 0.0 | 0.2 to 1.0 |
| 20 | x = z + (0.2 to 0.5) | 2 to 10 |
| 22 | z = 0.0 to 0.30 | 0.3 to 1.0 |
| 24 | y = z + (0.2 to 0.5) | 1 to 2 |
| 28 | 0.0 | 0.2 to 1.0 |

TABLE II

Approximate Compositions And Thicknesses Of Various Layers Shown In FIGS. 3 and 4:

| Layer | Approx. Composition (atomic fraction) | Approx. Thickness (microns) |
|---|---|---|
| 20 | x = 0.3 to 0.6 | 2 to 10 |
| 22 | z = 0.0 (GaAs) | 0.3 to 1.0 |
| 24 | y = 0.1 to 0.35 | 1 to 2 |
| 20 | x = z + (0.3 to 0.6) | 2 to 10 |
| 22 | z = 0.0 to 0.2 | 0.3 to 1.0 |
| 24 | y = z + (0.1 to 0.15) | 1 to 2 |

TABLE III

Figure 5:
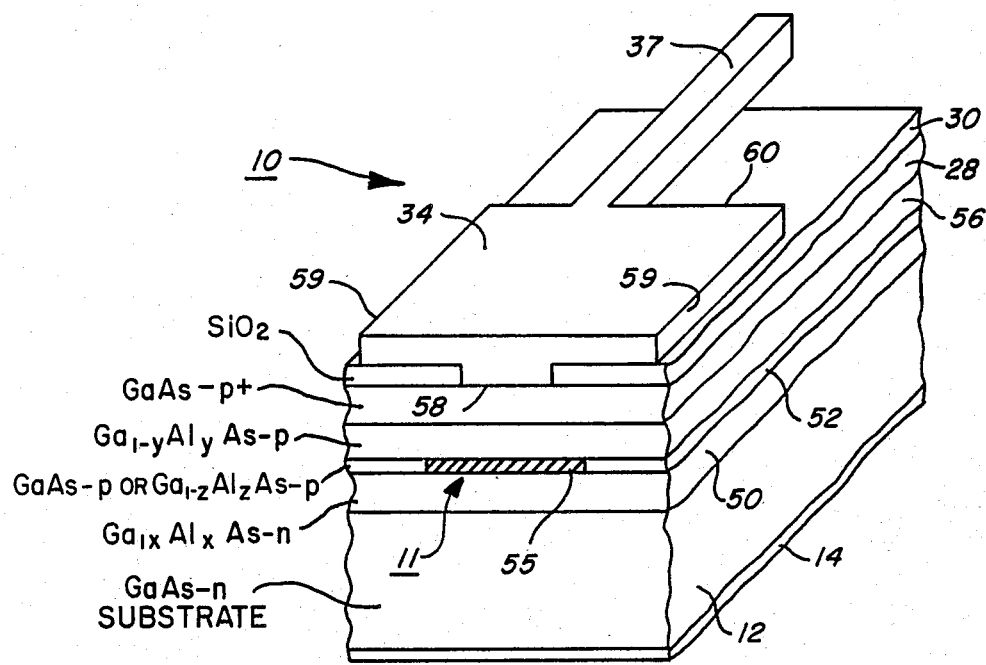
FIG. 5 is an isometric view of an edge emitting type IR LED fabricated in accordance with the teachings of the present invention.
Figure 6:
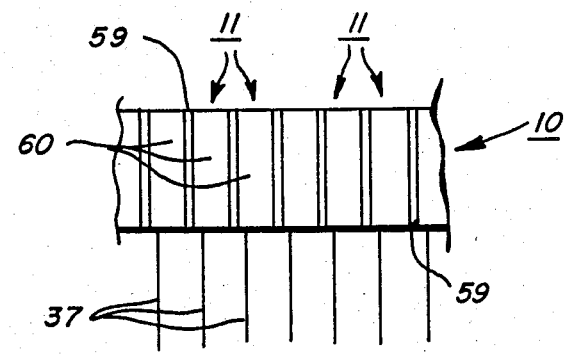
FIG. 6 is a top view showing the IR LED of FIG. 5 in a multiple LED array.

Approximate Compositions And Thicknesses Of Various Layers Shown In FIGS. 5 and 6:

| Layer | Approx. Composition (atomic fraction) | Approx. Thickness (microns) |
|---|---|---|
| 50 | x = z + (0.3 to 0.5) | 2 to 10 |
| 52 | z = 0.0 to 0.30 | 0.3 to 1 |
| 56 | y = z + (0.3 to 0.5) | 0.5 to 1.0 |
| 28 | 0.0 | 0.2 to 0.5 |

While the invention has been described with reference to the structure disclosed, it is not confined to the details set forth, but is intended to cover such modifications or changes as may come within the scope of the following claims.

I claim:

1. A method of fabricating a high speed, high resolution IR LED array for printing images, comprising the steps of:
   (a) metallizing one surface of a GaAs-n substrate to provide a common electrical contact for said LEDs;
   (b) growing a first layer of GaAlAs-n on the other surface of said substrate;
   (c) growing a second layer of GaAs-p or GaAlAs on said first layer;
   (d) growing a third layer of GaAlAs-p on said second layer;
   (e) growing an electrical contact layer of GaAs-p+ on said third layer;
   (f) depositing an insulating layer on said electrical contact layer;
   (g) etching both said insulating and said contact layers at selected points to expose predetermined areas of said third layer and form viewing windows defining each of said LEDs;
   (h) etching said portion of said insulating layer in the area bounding each of said viewing windows to expose a portion of said contact layer; and
   (i) metallizing said exposed portions of said contact layer to provide said individual electrical contacts for each of said LEDs.

2. The method according to claim 1 including the step of:
   metallizing both said third layer areas comprising said viewing windows together with the portion of said contact layer bounding said viewing windows with a transparent electrically conducting covering to provide said electrical contacts for each of said LEDs.

3. A method of fabricating a high speed, high resolution IR LED array for printing images, comprising the steps of:
   (a) metallizing one surface of a GaAs-n substrate to provide a common electrical contact for said LEDs;
   (b) growing a first layer of GaAlAs-n on the other surface of said substrate;
   (c) growing a second layer of GaAs-p or GaAlAs on said first layer;
   (d) growing a third layer of GaAlAs-p on said second layer;
   (e) depositing an insulating layer on said third layer;
   (f) etching said insulating layer at selected points to expose predetermined areas of said third layer and form viewing windows defining each of said LEDs;
   (g) metallizing the areas of said third layer comprising each of said viewing windows to provide individual electrical contacts for each of said LEDs; and
   (h) forming a light barrier between adjoining ones of said LEDs to prevent optical crosstalk between said adjoining LEDs.

4. The method according to claim 3 including the step of:
   forming said light barrier by etching a recess through said insulating, contacting, third, and second layers and into or through said first layer.

5. The method according to claim 4 including the step of:
   coating the inside walls of said light barrier with a light reflecting material.

6. The method according to claim 4 including the step of:
   coating the inside walls of said light barrier with a light absorbing material.

7. The method according to claim 3 including the step of:
   forming said light barrier by proton bombardment.

8. The method according to claim 4 including the step of:
   etching a rectangular recess for said light barrier.

9. The method according to claim 4 including the step of:
   etching a V-shaped recess for said light barrier.

* * * * *